(12) United States Patent
Sudo et al.

(10) Patent No.: US 7,105,272 B2
(45) Date of Patent: Sep. 12, 2006

(54) ACID-DEGRADABLE RESIN COMPOSITIONS CONTAINING KETENE-ALDEHYDE COPOLYMER

(75) Inventors: Atsushi Sudo, Kaho-gun (JP); Hideo Kubo, Ichihara (JP)

(73) Assignee: Nippon Soda Co., Ltd., Tokyo (JP)

( * ) Notice: Subject to any disclaimer, the term of this patent is extended or adjusted under 35 U.S.C. 154(b) by 41 days.

(21) Appl. No.: 10/504,496

(22) PCT Filed: Feb. 14, 2003

(86) PCT No.: PCT/JP03/01536

§ 371 (c)(1),
(2), (4) Date: Aug. 12, 2004

(87) PCT Pub. No.: WO03/069412

PCT Pub. Date: Aug. 21, 2003

(65) Prior Publication Data

US 2005/0130057 A1  Jun. 16, 2005

(30) Foreign Application Priority Data

Feb. 15, 2002 (JP) .......................... 2002-038044
Mar. 1, 2002 (JP) .......................... 2002-055276

(51) Int. Cl.
*G03C 1/00* (2006.01)
*C08G 63/68* (2006.01)
*G03C 1/56* (2006.01)

(52) U.S. Cl. ............ 430/270.1; 522/162; 522/59; 522/31; 522/57

(58) Field of Classification Search ............ 430/270.1; 522/166, 59, 31, 162
See application file for complete search history.

(56) References Cited

U.S. PATENT DOCUMENTS

| | | | |
|---|---|---|---|
| 5,356,740 A | 10/1994 | Steinmann | |
| 5,705,317 A | 1/1998 | Eichhorn et al. | |
| 5,739,214 A * | 4/1998 | Schunck | 525/438 |
| 5,925,718 A | 7/1999 | Lai et al. | |
| 6,303,266 B1 | 10/2001 | Okino et al. | |
| 2003/0054290 A1* | 3/2003 | Nishi et al. | 430/270.1 |

FOREIGN PATENT DOCUMENTS

| | | |
|---|---|---|
| DE | 41 02 170 A1 | 8/1992 |
| EP | 0 293 058 A2 | 11/1988 |
| EP | 0 400 855 A1 | 12/1990 |
| EP | 0 628 586 A1 | 12/1994 |
| JP | 2000-298344 | 10/2000 |
| JP | 2002-60475 | 2/2002 |

OTHER PUBLICATIONS

Ramiandrasoa, Parfait, et al., "Poly(☐-malic acid alkyl esters) derived from 4-alkyloxycarbonyl-2-oxetanones obtained via the ketene route", Polymer Bulletin, May 1993, vol. 30, No. 5, pp. 501-508.

Nagai, Daisuke, et al., "Novel Approach to Well-Defined Polyester by Living Anionic Alternating Copolymerization of Ethylphenylketene with 4-Methoxybenzaldehyde", Journal of Polymer Science, Part A: Polymer Chemistry, 2001, vol. 39, pp. 2078-2084.

* cited by examiner

*Primary Examiner*—Susan Berman
(74) *Attorney, Agent, or Firm*—Darby & Darby (57) ABSTRACT

It is intended to provide compositions to be used in resists and the like for forming fine patterns with a high sensitivity and a high resolution by increasing the difference in the solubilities between exposed parts and unexposed parts. Acid-degradable compositions contain a polymer having a repeating unit represented by the following general formula (I):

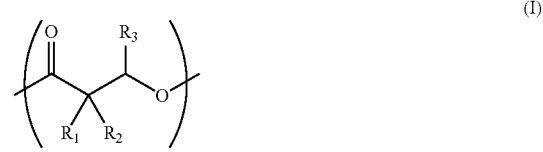

wherein $R_1$ and $R_2$ independently represent hydrogen atom, halogen atom, $C_{1-20}$ hydrocarbon group, a heterocyclic group, a cyano group, a nitro group, $C(=O)R_4$ group, $S(O)_n R_4$ group, $P(=O)(R_4)_2$ group or $M(R_4)_3$ group; $R_3$ represents $C_{1-20}$ hydrocarbon group or a heterocyclic group: $R_4$ represents $C_{1-20}$ hydrocarbonoxy group, $C_{1-20}$ hydrocarbon group, $C_{1-20}$ hydrocarbonthio group or mono- or di-$C_{1-20}$ hydrocarbonamino group; M represents a silicon, germanium, tin or lead atom; and n is 0, 1 or 2, and an acid or a compound capable of generating an acid in response to an external stimulus.

22 Claims, 1 Drawing Sheet

FIG. 1

ACID-DEGRADABLE RESIN COMPOSITIONS CONTAINING KETENE-ALDEHYDE COPOLYMER

CROSS-REFERENCE TO PRIOR APPLICATION

This is a U.S. national phase application under 35 U.S.C. §371 of International Patent Application No. PCT/JP03/01536 filed Feb. 14, 2003, and claims the benefit of Japanese Patent Application Nos. 2002-38044 filed Feb. 15, 2002 and 2002-55276 filed Mar. 1, 2002 which are incorporated by reference herein. The International Application was published in Japanese on Aug. 21, 2003 as WO 03/069412 A1 under PCT Article 2 1(2).

TECHNICAL FIELD

The present invention relates to a resist composition used for production of a semiconductor element and so forth. In particular, the present invention relates to a resist composition which is useful for forming a positive pattern using far ultraviolet rays of 300 nm or less, such as KrF excimer laser, or electron beam as exposure energy. The present invention also relates to a resin composition having stability to some extent yet main chains thereof may be cut by an acid to be dissociated into molecules of low molecular weight so as to be easily removed.

BACKGROUND ART

A chemical amplification type resist including an alkali soluble resin, an acid generator, and a solubility controlling agent having an acid unstable group is conventionally known as a resist composition used for production of a semiconductor element and so forth. In this type of composition, acid is generated from the acid forming agent when irradiated by ultraviolet rays, electron beam, or X-ray, and the acid thus generated makes chain reaction with the acid unstable groups to change the solubility of the alkali soluble resin so as to form a pattern. As the alkali soluble resin, a novolak resin, a phenol resin, an acryl resin, or copolymers thereof may be used, and there are cases in which an alkali soluble resin also serves as a solubility controlling agent having an acid unstable group, or a resin having an acid unstable group reacts with an acid to become alkali soluble.

However, since the difference in solubility in exposed parts and unexposed parts is generated by the presence or absence of acid unstable groups in a conventional chemical amplification type resist, it is considered that there is a limitation of some degree in performing a fine process.

An object of the present invention includes to provide a high sensitivity and high resolution resist composition which may be used for forming fine patterns by increasing the difference in solubility between exposed parts and unexposed parts.

DISCLOSURE OF INVENTION

Inventors of the present invention, after making diligent studies to solve the above problem, found that a resist composition including polymers of particular combination having an ester bonding in its main chain as a polymer component can achieve the above object, and completed the present invention.

That is, the present invention relates to:

(1) an acid degradable composition including a polymer having a repeating unit represented by the following general formula (I):

(I)

wherein $R_1$ and $R_2$ independently represent hydrogen atom, halogen atom, $C_{1-20}$ hydrocarbon group, a heterocyclic group, a cyano group, a nitro group, $C(=O)R_4$ group, $S(O)_n R_4$ group, $P(=O)(R_4)_2$ group or $M(R_4)_3$ group; $R_3$ represents $C_{1-20}$ hydrocarbon group or a heterocyclic group; $R_4$ represents $C_{1-20}$ hydrocarbonoxy group, $C_{1-20}$ hydrocarbon group, $C_{1-20}$ hydrocarbonthio group or mono- or di-$C_{1-20}$ hydrocarbonamino group; M represents a silicon, germanium, tin or lead atom; and n is 0, 1 or 2, and an acid or a compound capable of generating an acid in response to an external stimulus;

(2) an acid-degradable composition as set forth in (1), wherein the external stimulation is at least one selected from the group consisting of heat, pressure, and radiation, and (3) an acid-degradable composition as set forth in (1), wherein the compound capable of generating an acid in response to an external stimulus is a photosensitive compound which generates an acid by radiation irradiation.

The present invention also relates to:

(4) a photoresist composition, including: a polymer component having a repeating unit represented by the following general formula (I):

(I)

wherein $R_1$ and $R_2$ independently represent hydrogen atom, halogen atom, $C_{1-20}$ hydrocarbon group, a heterocyclic group, a cyano group, a nitro group, a $C(=O)R_4$ group, $S(O)_n R_4$ group, $P(=O)(R_4)_2$ group or $M(R_4)_3$ group; $R_3$ represents $C_{1-20}$ hydrocarbon group or a heterocyclic group; $R_4$ represents $C_{1-20}$ hydrocarbonoxy group, $C_{1-20}$ hydrocarbon group, $C_{1-20}$ hydrocarbonthio group or mono- or di-$C_{1-20}$ hydrocarbonamino group; M represents a silicon, germanium, tin or lead atom; and n is 0, 1, or 2;

(5) a photoresist composition, including the acid-degradable composition as set forth in any one of (1)–(3);

(6) a photoresist composition as set forth in (4) or (5), further including solvent;

(7) a photoresist composition as set forth in any one of (4)–(6), further including a basic compound;

(8) a composition as set forth in any one of (1)–(7), wherein the $R_1$ and $R_2$ independently represent $C_{1-20}$ hydrocarbon group, and the $R_3$ represents $C_{1-20}$ hydrocarbon group or a heterocyclic group in the general formula (I);

(9) a composition as set forth in any one of (1)–(8), wherein the $R_3$ in the formula (I) is a substituent represented by the following formula (II):

(II)

wherein $R_5$ represents hydrogen, or an acid degradable•eliminable group, $R_6$ represents a halogen atom or $C_{1-20}$ hydrocarbon group, m represents an integer of 1–3 and p represents 0 or an integer of 1–3 so as to satisfy $m+p \leq 5$, and when m is 2 or greater, $R_5$ may be the same or different from each other, and when p is 2 or greater, $R_6$ may be the same or different from each other;

(10) a composition as set forth in any one of (1)–(9), wherein a number average molecular weight of the polymer having the repeating unit represented by the formula (I) is within a range of 2,000 to 50,000, and (11) a composition as set forth in any one of (1)–(10), wherein a ratio (Mw/Mn) of a weight average molecular weight (Mw) and a number average molecular weight (Mn) of the polymer having the repeating unit represented by the formula (I) is within a range of 1.01 to 3.00.

In the repeating units represented by the formula (I) used in the present invention, $R_1$ and $R_2$ independently represent hydrogen, halogen atom, $C_{1-20}$ hydrocarbon group, a heterocyclic group, a cyano group, a nitro group, $C(=O)R_4$ group, $S(O)_nR_4$ group, $P(=O)(R_4)_2$ group or $M(R_4)_3$ group; $R_3$ represents $C_{1-20}$ hydrocarbon group or a heterocyclic group: $R_4$ represents $C_{1-20}$ hydrocarbonoxy group, $C_{1-20}$ hydrocarbon group, $C_{1-20}$ hydrocarbonthio group or mono- or di-$C_{1-20}$ hydrocarbonamino group; M represents a silicon, germanium, tin or lead atom; and n is 0, 1 or 2. Specific examples of $R_1$ and $R_2$ include hydrogen atom, halogen atoms, such as fluorine atom, chlorine atom, and bromine atom, $C_{1-20}$ alkyl groups, such as methyl group, ethyl group, n-propyl group, isopropyl group, n-butyl group, t-butyl group, s-butyl group, isobutyl group, n-pentyl group, s-pentyl group, isopentyl group, neopentyl group, n-hexyl group, s-hexyl group, 1,1-dimethyl-n-hexyl group, n-heptyl group, n-decyl group, and n-dodecyl group, $C_{2-20}$ alkynyl groups, such as vinyl group, allyl group, 2-butenyl group, 1-methyl-2-propenyl group, and 4-octenyl group, $C_{2-20}$ alkynyl groups, such as ethynyl group, propargyl group, and 1-methyl-propynyl group, $C_{3-20}$ alicyclic hydrocarbon groups, such as cyclopropyl group, cyclobutyl group, cyclopentyl group, 1-methylcyclopentyl group, 1-methylcyclohexyl group, 1-adamantyl group, 1-methyladamantyl group, 2-adamantyl group, 2-methyl-2-adamantyl group, and norbonyl group, $C_{6-20}$ aromatic hydrocarbon groups, such as phenyl group, 1-naphthyl group, and 9-anthracenyl group, heterocyclic groups, such as 2-pyridyl group, 3-pyridyl group, 4-pyridyl group, 2-furanyl group, 2-thienyl group, 3-thienyl group, 1-pyrrolo group, 2-oxazolyl group, 3-isooxazolyl group, 2-thiazolyl group, 3-isoazolyl group, 1-pyrrazolyl group, 4-pyrrazolyl group, 2-imidazolyl group, 1,3,4-oxadiazole-2-yl, 1,2,4-oxadiazole-5-yl, 1,3,4-thidiazole-2-yl, 1,2,4-thiadiazole-5-yl, 1,3,4-triazole-2-yl, 1,2,3-thiadiazole-5-yl, 1,2,3-triazole-4-yl, 1,2,3,4-tetrazole-5-yl, pyrimidine-2-yl, pyrimidine-4-yl, pyrazine-2-yl, pyridazine-3-yl, 1,2,4-triazine-6-yl, 1,3,5-triazine-2-yl, 1-pyrrolidinyl group, 1-pyperidyl group, 4-morpholinyl group, 2-tetrahydrofuranyl group, and 4-tetrahydropyranyl group, $C_{1-20}$ alkoxycarbonyl groups, such as methoxycarbonyl group, ethoxycarbonyl group, n-propoxycarbonyl group, isopropoxycarbonyl group, n-butoxycarbonyl group, and t-butoxycarbonyl group, $C_{1-20}$ alkylthiocarbonyl groups, such as methylthiocarbonyl group, substituted or unsubstituted carbamoyl groups, such as N,N-dimethylcarbamoyl group, substituted or unsubstituted sulfamoyl groups, such as methylsulfenyl group, phenylsulfenyl group, methyl sulfinyl group, phenyl sulfinyl group, methylsulfonyl group, phenylsulfonyl group, methylsulfuryl group, and N,N-dimethylsulfamoyl group, phosphonyl groups, such as dimethylphosphonyl group, bis-methylthiophosphonyl group, and tetramethylaminophosphonyl group, trimethylsilyl group, t-butyldimethylsilyl group, phenyldimethylsilyl group, trimethylstannyl group, and triphenylpranbanyl group.

Also, $R_3$ represents $C_{1-20}$ hydrocarbon groups, and heterocyclic groups, and specific examples thereof include the same substituents explained for $R_1$ and $R_2$.

Each of the substituents for $R_1$ to $R_3$ described above may have substituents attached to suitable carbon atoms. Example of such substituents include halogen atoms, such as fluorine atom, chlorine atom, and bromine atom, $C_{1-20}$ alkyl groups, such as methyl group, ethyl group, n-propyl group, isopropyl group, n-butyl group, t-butyl group, n-hexyl group, fluoromethyl group, difluoromethyl group, trifluoromethyl group, perfluoroethyl group, cyclopropyl group, and cyclohexyl group, vinyl group, allyl group, phenyl group, substituted phenyl groups, such as 4-chlorophenyl group, 4-methoxyphenyl group, and 3,4-dimethylphenyl group, hydrocarbon groups, such as propargyl group, 2-hydroxy-1,1,1,3,3,3-hexafluoro-2-propyl group, and 2-(ethoxymethoxy)-1,1,1,3,3,3-hexafluoro-2-propyl group, alkoxy groups, such as methoxy group, ethoxy group, n-propoxy group, isopropoxy group, n-butoxy group, s-butoxy group, isobutoxy group, t-butoxy group, fluoromethoxy group, difluoromethoxy group, trifluoromethoxy group, phenoxy group, 4-chlorophenoxy group, benzyloxy group, phenethyloxy group, t-butoxycarbonyloxy group, tetrahydropyranyloxy group, phenoxyethoxy group, ethoxyethoxy group, trimethylsilyloxy group, and t-butoxycarbonylmethoxy group, amino groups, such as amino group, methylamino group, dimethylamino group, and t-butoxycarbonylamino group, alkyltio, arylthio, or heterocyclicthio groups or oxidants thereof, such as methylthio group, phenylthio group, 2-pyrridylthio group, methylsulfenyl group, and methylsulfonyl group, $C_{1-20}$ alkoxycarbonyl groups, such as methoxycarbonyl group, ethoxycarbonyl group, n-propoxycarbonyl group, isopropoxycarbonyl group, n-butoxycarbonyl group, and t-butoxycarbonyl group, $C_{2-20}$ acyl groups, such as acetyl group, propanoyl group, benzoyl group, and 2-pyrridylcarbonyl group, cyano group, and nitro group.

Examples of $R_1$–$R_3$ group having these substituents include haloalkyl groups, such as chloromethyl group, fluoromethyl group, bromomethyl group, dichloromethyl group, difluoromethyl group, dibromomethyl group, trichloromethyl group, trifluoromethyl group, tribromomethyl group, trichloromethyl group, 2,2,2-trifluoroethyl group, pentafluoroethyl group, 3,3,3-trifluoropropyl group, and 1,1,2,3,3,3-hexafluoropropyl group, haloalkenyl groups, such as tetrafluoroethenyl group, and 2,2-difluoroethenyl group, alkoxyalkyl groups, such as methoxymethyl group, methoxyethyl group, and phenoxymethyl group, alkylthioalkyl groups or arylthioalkyl groups, such as methylthiomethyl group, and phenylthiomethyl group, aralkyl groups, such as benzyl group, diphenylmethyl group, trityl group, and phenethyl group, acylalkyl groups, such as benzoylmethyl group, and acetylmethyl group, and cyanomethyl group.

Also, preferable examples of substituents include, in particular, those expressed by the formula (II). In the substituents expressed by the formula (II), $R_5$ represents hydrogen, or an acid removable/degradable group, m represents an integer of 1–3, and when m is 2 or greater, $R_5$ may be the same or different from each other. In this specification, the term "acid removable/degradable group" means a group which may be eliminated and/or degraded by an acid. Specific examples thereof include methoxymethyl group, 2-methoxyethoxymethyl group, bis(2-chloroethoxy)methyl group, tetrahydropyranyl group, 4-methoxytetrahydropyranyl group, tetrahydrofuranyl group, triphenylmethyl group, trimethylsilyl group, 2-(trimethylsilyl)ethoxymethyl group, t-butyldimethylsilyl group, trimethylsilylmethyl group, and substituents expressed by the following formulae:

wherein k represents 0 or 1, and further may include a group expressed by the following formula:

wherein $R_{14}$ represents $C_{1-20}$ unsubstituted or alkoxy substituted alkyl group, $C_{5-10}$ cycloalkyl group, or $C_{6-20}$ unsubstituted or alkoxy substituted aryl group, $R_{15}$ represents hydrogen or $C_{1-3}$ alkyl group, $R_{16}$ represents hydrogen, $C_{1-6}$ alkyl group, or $C_{1-6}$ alkoxy group. Specific examples of such substituents include 1-methoxyethyl group, 1-ethoxyethyl group, 1-methoxypropyl group, 1-methyl-1-methoxyethyl group, and 1-(isopropoxy)ethyl group. The position of substituting alkoxy group ($OR_5$ group) is not particularly limited, however, meta- or para-positions are preferable.

Also, $R_6$ represents a halogen atom, or $C_{1-20}$ hydrocarbon group. Specific examples thereof include the substituents of $R_1$ and $R_2$ which correspond to the above limitations, and the substituting position thereof is not particularly limited. Also, p represents 0 or an integer of 1–3, and satisfies the relationship of $m+p \leqq 5$. When p is 2 or greater, $R_6$ may be the same or different from each other.

Specific examples of the substituents expressed by the formula (II) include 4-hydroxyphenyl group, 4-hydroxy-3-methylphenyl group, 4-t-butoxyphenyl group, 4-tetrahydropyranyloxyphenyl group, 4-phenoxyethoxyphenyl group, 4-trimethylsilyloxyphenyl group, 4-t-butoxycarbonyloxyphenyl group, 4-t-butoxycarbonylmethoxyphenyl group, 2,3-difluoro-4-hydroxyphenyl group, 2,3-difluoro-4-t-butoxyphenyl group, 2,6-difluoro-4-hydroxyphenyl group, 2,6-difluoro-4-t-butoxyphenyl group, 3,5-difluoro-4-hydroxyphenyl group, 3,5-difluoro-4-t-butoxyphenyl group, 2,3,5,6-tetrafluoro-4-hydroxyphenyl group, 2,3,5,6-tetrafluoro-4-t-butoxyphenyl group, 2-trifluoromethyl-4-hydroxyphenyl group, 2-trifluoromethyl-4-t-butoxyphenyl group, 2-trifluoromethyl-6-fluoro-4-hydroxyphenyl group, 2-trifluoromethyl-6-fluoro-4-t-butoxyphenyl group, 3-trifluoromethyl-5-fluoro-4-hydroxyphenyl group, 3-trifluoromethyl-5-fluoro-4-t-butoxyphenyl group, 4-(1-ethoxyethoxy)phenyl group, 4-(2-hydroxy-1,1,1,3,3,3-hexafluoro-2-propyl)phenyl group, 4-(2-ethoxymethoxy-1,1,1,3,3,3-hexafluoro-2-propyl)phenyl group, and so forth.

The substituents expressed by the formula (II), which indicate the preferable examples for $R_3$, are also preferable examples of substituents for $R_1$ and $R_2$.

Moreover, each of the substituents expressed as $R_1$-$R_3$ need not be the same throughout all of the repeating units expressed by the formula (I), and two or more different kinds of substituents may be suitably used. For example, as a substituent of $R_3$, p-methoxyphenyl group and p-(1-ethoxyethoxy)phenyl group may be used in the form of a mixture with the molar ratio of 1/99 to 99/1.

The polymer having the repeating unit expressed by the formula (I) of the present invention means polymers which include only the repeating unit expressed by the formula (I), and polymers which include the repeating unit expressed by the formula (I) and repeating units expressed by other than the formula (I).

Specific examples of the repeating units other than the repeating unit expressed by the formula (I) include the repeating unit expressed by the following formula (III):

$$\left(\begin{array}{c} R_{31} \\ R_{32} \end{array} \begin{array}{c} R_{33} \\ R_{34} \end{array}\right) \quad \text{(III)}$$

wherein $R_{31}$, $R_{32}$, and $R_{33}$ independently represent hydrogen atom, fluorine atom, $C_{1-20}$ linear, branch, or cyclic alkyl group or fluorinated alkyl group, $R_{34}$ represents hydroxyl group, $C_{6-20}$ aromatic hydrocarbon group which may be substituted by an alkoxy group, or $CO_2R_{35}$ group, and $R_{35}$ represents $C_{1-20}$ hydrocarbon group, preferably an acid unstable group.

In the case described above, examples of the $C_{1-20}$ linear, branched, or cyclic alkyl group include methyl group, ethyl group, propyl group, isopropyl group, n-butyl group, sec-butyl group, tert-butyl group, cyclopentyl group, cyclohexyl group, 2-ethylhexyl group, n-octyl group, etc., and use of one having the number of carbon atoms of 1–12, particularly one having the number of carbon atoms of 1–10, is preferable. Note that the fluorinated alkyl group means that a part or all of hydrogen atoms in the above-mentioned alkyl group are substituted with fluorine atoms, and examples thereof include trifluoromethyl group, 2,2,2-trifluoroethyl group, 3,3,3-trifluoropropyl group, and 1,1,2,3,3,3-hexafluoropropyl group.

$R_{34}$ represents hydroxyl group or $C_{6-20}$ aromatic hydrocarbon group whose hydrogen atoms may be substituted by a substituted hydroxyl group, and specific examples thereof include a substituent group which may be expressed by the following formula (IV):

(IV)

wherein $R_{40}$ represents linear, branched, or cyclic alkyl group or fluorinated alkyl group, and specific examples thereof include the same substituents described for the above $R_{31}$, X represents fluorine atom, $R_{41}$ represents $C_{1-20}$ hydrocarbon group, preferably an acid unstable group. Also, each of a, b, c, and d represents 0 or an integer of 1–5, and a+b+c+d is any one of 0–5.

In $R_{41}$, examples of $C_{1-20}$ hydrocarbon group include the same substituents described for $R_1$. Also, although the acid unstable group may be selected from various groups, specific examples thereof include groups represented by the following formula (V), (VI), or (VII), trialkylsilyl group in which the number of carbon atoms in each alkyl group is 1–6, $C_{4-20}$ oxoalkyl group and so forth:

(V)

(VI)

(VII)

wherein $R_{51}$, and $R_{54}$ in the formulae (V) and (VI), respectively, represents monovalent hydrocarbon group, such as $C_{1-20}$ linear, branched, and cyclic alkyl group, which may include a hetero atom, such as oxygen atom, sulfur atom, nitrogen atom, and fluorine atom.

$R_{52}$ and $R_{53}$ represents hydrogen atom or $C_{1-20}$ linear, branched, or cyclic alkyl group, which may include a hetero atom, such as oxygen atom, sulfur atom, nitrogen atom, and fluorine atom. Also, $R_{52}$ and $R_{53}$, $R_{52}$ and $R_{54}$, and $R_{53}$ and $R_{54}$ may be bonded to each other to form a ring. Moreover, h represents 0 or an integer of 1–10.

More preferably, $R_{51}$ to $R_{54}$ are the following groups. $R_{51}$ is $C_{4-20}$, more preferably $C_{4-15}$, tertiary alkyl group, in which each alkyl group represents $C_{1-6}$ trialkylsilyl group, $C_{4-20}$ oxoalkyl group, or the group expressed by the above formula (VII). Specific examples of the tertiary alkyl group include tert-butyl group, tert-amyl group, 1,1-diethylpropyl group, 1-ethylcyclopentyl group, 1-butylcyclopentyl group, 1-ethylcyclohexyl group, 1-butylcyclohexyl group, 1-ethyl-2-cyclopentenyl group, 1-ethyl-2-cyclohexenyl group, 2-methyl-2-adamantyl group and so forth. Specific examples of the trialkylsilyl group include trimethylsilyl group, triethylsilyl group, dimethyl-tert-butylsilyl group and so forth. Specific examples of the oxoalkyl group include 3-oxocyclohexyl group, 4-methyl-2-oxooxane-4-yl group, 5-methyl-5-oxooxolane-4-yl, and so forth.

$R_{52}$ and $R_{53}$ represent hydrogen atom or $C_{1-18}$, more preferably $C_{1-10}$, linear, branched, or cyclic alkyl group, and specific examples thereof include methyl group, ethyl group, propyl group, isopropyl group, n-butyl group, sec-butyl group, tert-butyl group, cyclopentyl group, cyclohexyl group, 2-ethylhexyl group, n-octyl group and so forth. Also, $R_{54}$ represents $C_{1-18}$, more preferably $C_{1-10}$, monovalent hydrocarbon group which may have a hetero atom, such as oxygen, and includes linear, branched, or cyclic alkyl group, and those in which a part of hydrogen atoms thereof is substituted with hydroxyl group, alkoxy group, oxo group, amino group, alkylamino group. Specific examples thereof include substituted alkyl group, such as 4-hydroxybutyl group, 2-butoxyethyl group, 4-hydroxymethyl-1-cyclohexylmethyl group, 2-hydroxyethoxy-2-ethyl group, 6-hydroxyhexyl group, and 1,3-dioxolane-2-one-4-methyl group.

Also, $R_{52}$ and $R_{53}$, $R_{52}$ and $R_{54}$, and $R_{53}$ and $R_{54}$ may form a ring, and when such a ring is formed, each of $R_{52}$, $R_{53}$, and $R_{54}$ represents $C_{1-18}$, more preferably $C_{1-10}$, linear or branched alkylene group.

Specific examples of the group expressed by the above formula (V) include t-butoxycarbonyl group, t-butoxycarbonylmethyl group, t-amyloxycarbonyl group, t-amyloxycarbonylmethyl group, 1,1-diethylpropyloxycarbonyl group, 1,1-diethylpropyloxycarbonylmethyl group, 1-ethylcyclopentyloxycarbonyl group, 1-ethycyclopentyloxycarbonylmethyl group, 1-ethyl-2-cyclopentenyloxycarbonyl group, 1-ethyl-2-cyclopentenyloxycarbonylmethyl group, 1-ethoxyethoxycarbonylmethyl group, 2-tetrahydropyranyloxycarbonylmethyl group, and 2-tetrahydrofuranyloxycarbonylmethyl group.

Specific examples of linear or branched acid unstable group expressed by the above formula (VI) include methoxymethyl group, ethoxymethyl group, n-propoxymethyl group, n-butoxymethyl group, isopropoxymethyl group, t-butoxymethyl group, 1-methoxy-ethyl group, 1-ethoxyethyl group, 1-methoxy-propyl group, 1-methoxy-butyl group, 1-ethoxy-propyl group, 1-ethoxy-propyl group, 1-n-propoxyethyl group, 1-n-propoxyethyl group, 1-n-propoxy-propyl group, 1-n-butoxy-butyl group, 1-n-propoxy-butyl group, 1-cyclopentyloxy-ethyl group, 1-cyclohexyloxy-ethyl group, 2-methoxy-2-propyl group, 2-ethoxy-2-propyl group, and so forth.

Specific examples of the acid unstable group expressed by the above formula (VI) which form a ring shape include tetrahydrofuran-2-yl group, 2-methyltetrahydrofuran-2-yl group, tetrahydropyran-2-yl group, 2-methyltetrahydropyran-2-yl group and so forth. As the formula (IV), 1-ethoxy-ethyl group, 1-n-butoxy-ethyl group, and 1-ethoxy-n-propyl group are preferable.

In the formula (VII), $R_{55}$, $R_{56}$, and $R_{57}$ represent monovalent hydrocarbon group, such as $C_{1-20}$ linear, branched, or cyclic alkyl group, which may have a hetero atom, such as oxygen atom, sulfur atom, and nitrogen atom, and fluorine atom. Also, $R_{55}$ and $R_{56}$, $R_{55}$ and $R_{57}$, and $R_{56}$ and $R_{57}$ may be bonded to each other to form a ring.

Examples of the tertiary alkyl group which is expressed by the formula (VII) include t-butyl group, 1,1-diethyl-n-propyl group, 1-ethylnorbonryl group, 1-methylcyclohexyl group, 1-ethylcyclopentyl group, 2-(2-methyl)adamantyl group, 2-(2-ethyl)adamantyl group, tert-amyl group and so forth.

Also, specific examples of the tertiary alkyl group which is expressed by the formula (VII) may include the following functional groups:

wherein $R_{61}$ and $R_{64}$ represent $C_{1-6}$ linear, branched, or cyclic alkyl group, and specific examples thereof include methyl group, ethyl group, propyl group, isopropyl group, n-butyl group, sec-butyl group, n-pentyl group, n-hexyl group, cyclopropyl group, cyclopropylmethyl group, and so forth. Also, $R_{62}$ represents hydrogen atom, $C_{1-6}$ monovalent hydrocarbon group which may include hetero atom, or monovalent hydrocarbon atom, such as $C_{1-6}$ alkyl group which may contain hetero atoms therein. Examples of the hetero atom include oxygen atom, sulfur atom, and nitrogen atom, and these atoms may be included or inserted in the form of —OH, —OR (wherein R represents $C_{1-20}$, particularly $C_{1-16}$, alkyl group, the same definition will be applied hereinafter), —O—, —S—, —S(=O)—, —NH$_2$, —NHR, —NR$_2$, —NH—, and —NR—.

Also, $R_{63}$ represents hydrogen atom, $C_{1-20}$, particularly $C_{1-16}$ alkyl group, hydroxyalkyl group, alkoxyalkyl group, alkoxy group, and so forth, and these may be linear, branched or cyclic. Specific examples thereof include methyl group, hydroxymethyl group, ethyl group, hydroxyethyl group, propyl group, isopropyl group, n-butyl group, sec-butyl group, n-pentyl group, n-hexyl group, methoxy group, methoxymethoxy group, ethoxy group, tert-butoxy group, and so forth.

Moreover, examples of the trialkylsilyl group in which the number of carbon atoms in each alkyl group is 1–6 that may be used as an acid unstable group of $R_{41}$ include trimethylsilyl group, triethylsilyl group, tert-butyldimethylsilyl group, and so forth.

Furthermore, examples of $C_{4-20}$ oxoalkyl group which may be used as an acid unstable group of $R_{41}$ include 3-oxocyclohexyl group and the groups expressed by the following formulae:

Also, the above acid unstable group of $R_{41}$ may be an acetal cross-linked group expressed by the following formula (VIII) or (IX):

wherein $R_{71}$ and $R_{72}$ represents hydrogen atom or $C_{1-8}$ linear, branched, or cyclic alkyl group, or $R_{71}$ and $R_{72}$ may be bonded to each other to form a ring. When a ring is formed, $R_{71}$ and $R_{72}$ represent linear or branched alkylene group having the number of carbon atoms of 1–8. $R_{73}$ represents linear, branched, or cyclic alkylene group having the number of carbon atoms of 1–10. Also, e represents an integer of 1–7, and f and g represents 0 or an integer of 1–10. A represents $C_{1-50}$ aliphatic group or saturated alicyclic hydrocarbon group having valency of (e+1), aromatic hydrocarbon group, or hetero cyclic group, and these groups may include intervened hetero atoms, or a part of hydrogen atoms which are bonded to carbon atoms thereof may be substituted with hydroxyl group, carboxyl group, carbonyl group, or fluorine atom. B represents —CO—O—, —NHCO—O—, or —NHCONH—.

Specific examples of the cross-linked acetal expressed by the formulae (VIII) and (IX) include the following:

Specific examples of the repeating unit (III) having the functional group expressed by the formula (IV) include repeating units which may be obtained by polymerizing the following monomers:

Styrene, α-methylstyrene, chlorostyrene, 1,1-diphenylethylene, stilbene, 4-hydroxystyrene, 4-hydroxy-α-methyl-styrene, 4-hydroxy-3-methyl-styrene, 4-t-butoxy-styrene, 4-tetrahydropyranyloxy-styrene, 4-phenoxyethoxy-styrene, 4-trimethylsilyloxy-styrene, 4-t-butoxycarbonyloxy-styrene, 4-t-butoxycarbonylmethoxy-styrene, 2,3-difluoro-4-hydroxystyrene, 2,3-difluoro-4-t-butoxy-styrene, 2,6-difluoro-4-hydroxy-styrene, 2,6-difluoro-4-t-butoxy-styrene, 3,5-difluoro-4-hydroxy-styrene, 3,5-difluoro-4-t-butoxy-styrene, 2,3,5,6-tetrafluoro-4-hydroxy-styrene, 2,3,5,6-tetrafluoro-4-t-butoxy-styrene, 2-trifluoromethyl-4-hydroxy-styrene, 2-trifluoromethyl-4-t-butoxy-styrene, 2-trifluoromethyl-6-fluoro-4-hydroxy-styrene, 2-trifluoromethyl-6-fluoro-4-t-butoxy-styrene, 3-trifluoromethyl-5-fluoro-4-hydroxy-styrene, 3-trifluoromethyl-5-fluoro-4-t-butoxy-styrene, 4-(1-ethoxyethoxy)-styrene, 4-(2-hydroxy-1,1,1,3,3,3-hexafluoro-2-propyl)-styrene, 4-(2-ethoxymethoxy-1,1,1,3,3,3-hexafluoro-2-propyl)-styrene, 2,3-difluoro-4-hydroxy-styrene, 2,3-difluoro-4-t-butoxy-α-fluoro-styrene, 2,6-difluoro-4-hydroxy-α-fluoro-styrene, 2,6-difluoro-4-t-butoxy-α-fluoro-styrene, 3,5-difluoro-4-hydroxy-α-fluoro-styrene, 3,5-difluoro-4-t-butoxy-α-fluoro-styrene, 2,3,5,6-tetrafluoro-4-hydroxy-α-fluoro-styrene, 2,3,5,6-tetrafluoro-4-t-butoxy-α-fluoro-styrene, 2-trifluoromethyl-4-hydroxy-α-fluoro-styrene, 2-trifluoromethyl-4-t-butoxy-α-fluoro-styrene, 2-trifluoromethyl-6-fluoro-4-hydroxy-α-fluoro-styrene, 2-trifluoromethyl-6-fluoro-4-t-butoxy-α-fluoro-styrene, 3-trifluoromethyl-5-fluoro-4-hydroxy-α-fluoro-styrene, 3-trifluoromethyl-5-fluoro-4-t-butoxy-α-fluoro-styrene, 4-(1-ethoxyethoxy)-α-methyl-styrene, 4-(2-hydroxy-1,1,1,3,3,3-hexafluoro-2-propyl)-α-fluoro-styrene, 4-(2-ethoxymethoxy-1,1,1,3,3,3-hexafluoro-2-propyl)-α-fluoro-styrene, and so forth.

Also, when $R_{34}$ is $CO_2R_{35}$ group, examples of $R_{35}$ include the same substituent groups as those described for $R_4$. In such a case, as combinations of $R_{31}$-$R_{33}$, those represented by the following formula may be preferably used (these may be obtained when the following compounds are polymerized and indicate a repeating unit).

Specific examples of the repeating units having $CO_2R_{35}$ group include repeating units which may be derived from acrylates, such as methyl acrylate, ethyl acrylate, propyl acrylate, amyl acrylate, cyclohexyl acrylate, ethylhexyl acrylate, octyl acrylate, t-octyl acrylate, chlorethyl acrylate, 2-ethoxyethyl acrylate, 2,2-dimethyl-3-ethoxypropyl acrylate, 5-ethoxypentyl acrylate, 1-methoxyethyl acrylate, 1-ethoxyethyl acrylate, 1-methoxypropyl acrylate, 1-methyl-1-methoxyethyl acrylate, 1-(isopropoxy)ethyl acrylate, benzyl acrylate, methoxybenzyl acrylate, furfuryl acrylate, and tetrahydrofurfuryl acrylate, methacrylates, such as methyl methacrylate, ethyl methacrylate, propyl methacrylate, isopropyl methacrylate, amyl methacrylate, hexyl methacrylate, cyclohexyl methacrylate, benzyl methacrylate, chlorbenzyl methacrylate, octyl methacrylate, 2-ethoxyethyl methacrylate, 4-methoxybutyl methacrylate, 5-methoxypentyl methacrylate, 2,2-dimethyl-3-ethoxypropyl methacrylate, 1-methoxyethyl methacrylate, 1-ethoxyethyl methacrylate, 1-methoxypropyl methacrylate, 1-methyl-1-methoxyethyl methacrylate, 1-(isopropoxy)ethyl methacrylate, furfuryl methacrylate, and tetrahydrofurfuryl methacrylate, crotonates, such as methyl crotonate, ethyl crotonate, propyl crotonate, amyl crotonate, cyclohexyl crotonate, ethylhexyl crotonate, octyl crotonate, t-octyl crotonate, chloroethyl crotonate, 2-ethoxyethyl crotonate, 2,2-dimethyl-3-ethoxypropyl crotonate, 5-ethoxypentyl crotonate, 1-methoxyethyl crotonate, 1-ethoxyethyl crotonate, 1-methoxypropyl crotonate, 1-methyl-1-methoxyethyl crotonate, 1-(isopropoxy)ethyl crotonate, benzyl crotonate, methoxybenzyl crotonate, furfuryl crotonate, and tetrahydrofurfuryl crotonate, itaconates, such as dimethyl itaconate, diethyl itaconate, dipropyl itaconate, diamyl itaconate, dicyclohexyl itaconate, bis(ethylhexyl) itaconate, dioctyl itaconate, di-t-octyl itaconate, bis(chloroethyl) itaconate, bis(2-ethoxyethyl) itaconate, bis(2,2-dimethyl-3-ethoxypropyl) itaconate, bis(5-ethoxypentyl) itaconate, bis(1-methoxyethyl) itaconate, bis(1-ethoxyethyl) itaconate, bis(1-methoxypropyl) itaconate, bis(1-methyl-1-methoxyethyl) itaconate, bis(1-(isopropoxy)ethyl) itaconate, dibenzyl itaconate, bis(methoxybenzyl) itaconate, difurfuryl itaconate, ditetrahydrofurfuryl itaconate. Also, repeating units expressed by the following formula may be included as the examples thereof.

Also, examples of the repeating units other than those expressed by the formula (I) include compounds expressed by the formula (X):

(X)

wherein $R_{81}$ and $R_{82}$ independently represent hydrogen, halogen atom, $C_{1-20}$ hydrocarbon group, a heterocyclic group, a cyano group, a nitro group, $C(=O)R_4$ group, $S(O)_nR_4$ group, $P(=O)(R_4)_2$ group or $M(R_4)_3$ group, and specific examples thereof include the same substituents as those described for $R_1$.

As described above, the polymer having the repeating unit expressed by the formula (I) of the present invention means polymers which include only the repeating unit expressed by the formula (I) and polymers which include the repeating unit expressed by the formula (I) and repeating units expressed by other than the formula (I). The polymerized structure of the repeating unit expressed by the formula (I) with the repeating unit other than the formula (I) is not particularly limited, and may be in any structure of random polymerization, block polymerization, part block polymerization, and alternating polymerization.

Also, the mixing ratio of the repeating unit expressed by the formula (I) with the other repeating unit is not particularly limited, and may be arbitrarily set within the range of 99/1 to 1/99 in molar ratio.

Although the number average molecular weight of the polymer including the repeating unit expressed by the formula (I) is not particularly limited, it is preferably in the range of 2,000 to 50,000 in consideration of dry etch resistance, alkali solubility, etc., when used for resists and so forth. Also, although the molecular weight distribution, which is the ratio of the weight average molecular weight (Mw) with the number average molecular weight (Mn), is also not particularly limited, it is preferably within the range of 1.01–3.00, more preferably within the range of 1.01–1.50 from the viewpoint of carrying out fine processes for resists and so forth.

Specific examples of methods for preparing polymers having the repeating unit expressed by the formula (I) include a method in which ketene expressed by the following formula (XI) and aldehyde expressed by the following formula (XII) are anionically polymerized in the presence of an anionic polymerization initiator:

(XI)

(XII)

wherein $R_{91}$, $R_{92}$, and $R_{93}$ correspond to $R_1$, $R_2$, and $R_3$, respectively, and exclude substituents which interfere with the anionic polymerization, for example, a substituent having an active hydrogen atom, substituents which show reactivity with the anionic polymerization initiator, and so forth.

Solvent used for anionic polymerization are not particularly limited as long as it does not involve the polymerization reaction and is a polar solvent compatible with the polymer. Specific examples thereof include aliphatic hydrocarbons, such as n-hexane and n-heptane, alicyclic hydrocarbons, such as cyclohexane and cyclopentane, aromatic hydrocarbons, such as benzene and toluene, ethers, such as diethyl ether, tetrahydrofuran (THF), and dioxane, and organic solvent which is generally used for anionic polymerization, such as anisole, and hexamethylphosphoramide. These may be used singularly or in mixture of two or more.

Examples of the anionic polymerization initiator include an alkali metal and an organic alkali metal. Examples of the alkali metal include lithium, sodium, potassium, cesium, sodium-potassium alloy, and so forth. As the organic alkali metal, alkylate, allylate, arylate, etc., of the above alkali metals may be used, and specific examples thereof include ethyl lithium, n-butyl lithium, sec-butyl lithium, t-butyl lithium, ethyl sodium, lithium biphenyl, lithium naphthalene, lithium triphenyl, sodium naphthalene, potassium naphthalene, α-methylstyrene sodiumdianion, 1,1-diphenylhexyl lithium, 1,1-diphenyl-3-methylpentyl lithium, 1,1-diphenylmethyl potassium, 1,4-dilithio-2-butene, 1,6-dilithiohexane, polystylyl lithium, cumyl potassium, and cumyl cesium. These compounds may be used singularly or in a mixture of two or more.

In general, an living anionic polymerization is carried out by adding the compounds expressed by the formula (XI) and (XII) to an anionic polymerization initiator. The series of reactions is carried out at a temperature of −100 to 0° C., preferably −70 to −20° C. in the presence of an inert gas, such as argon and nitrogen, or in a vacuum of high degree. The molar ratio of the ketene expressed by the formula (XI) with the aldehyde expressed by the formula (XII) is not particularly limited; however, it is preferable to be within the range of 99/1 to 50/50. Also, as described above, the ketene expressed by the formula (XI) and the aldehyde expressed by the formula (XII), respectively, may be used singularly or in a mixture of two or more.

Also, among polymers in which $R_3$ is a substituent expressed by the formula (II), compounds in which $R_5$ is hydrogen atom may be obtained by carrying out a polymerization reaction using a compound having functional groups other than hydrogen atom, and deprotecting the functional groups. In such a reaction, it is possible to deprotect only a part of the above functional groups by controlling the reaction. For example, the reaction in which a part or all of protecting groups of phenolic hydroxyl groups which are unstable in acid, may generally be carried out at a temperature range of room temperature to 150° C. using an acidic agent, such as hydrochloric acid, nitric acid, hydrochloric acid gas, hydrobromic acid, p-toluene sulfonic acid, trifluoroacetic acid, methanesulfonic acid, trifluoromethane sulfonic acid, and heavy sulphate expressed by the general formula $XHSO_4$ (wherein X is an alkali metal, such as Li, Na, and K), as a catalyst under the presence of a single or a mixed solvent, other than those described for the above polymerization reaction, of alcohols, such as methanol and ethanol, ketones, such as acetone and methylethylketone, polyol derivatives, such as methyl Cellosolve and ethyl Cellosolve, and water. Also, for the case in which a silyl group is used as a protecting group, fluoride anion compounds, such as quaternary ammonium fluoride, may even used.

Although a catalytic amount is sufficient for the amount of acidic agent used, it is generally in the range of 0.1 to 3 equivalents, preferably 0.1 to 1 equivalents with respect to the number of moles of alkoxy group ($OR_5$ group) which is obtained by calculating an average molecular weight of the entire polymer from the molar fraction and molecular weight of each unit, and by calculating the number of moles of each unit from the total weight of the polymer, the average molecular weight, and the molar fraction.

Also, it is possible to introduce another functional group to the hydroxyl group part which is obtained as described above. Although the above process is explained using $R_3$ substituent as an example, it is possible to carry out the process for substituents similar to $OR_5$ on $R_1$ and $R_2$.

Since polymers having the repeating unit expressed by the formula (I) has properties in which the main chain thereof is readily cleaved by an acid as described later in Examples, it may function as an acid-degradable composition in a composition including an acid or a compound capable of generating an acid in response to an external stimulation, and may be suitably used as a resist composition in particular. When it is used as a resist composition, it is possible to mix polymer therewith, which is conventionally used for a chemical amplifier positive resist.

The acid used in the present invention is not particularly limited as long as it is an acidic compound, and specific examples thereof include hydrochloric acid, nitric acid, phosphoric acid, phosphorus oxychloride, methane sulfonic acid, p-toluene sulfonic acid, p-toluene sulfonic acid.pyridinium salt, chlorsulfonic acid, trichloro acetic acid, benzoic acid, and so forth.

In a compound capable of generating acid in response to an external stimulation, examples of the external stimulation include heat, pressure, radiation, and so forth, and a compound which generates acid by radiation (hereinafter referred to as "acid generator") may preferably be used when the above-mentioned composition is used as a resist composition in particular. The polymer having the repeating unit expressed by the formula (I) and the acid generator are generally used in a state being dissolved in solvent.

The acid generators used in the present invention are not particularly limited as long as they are capable of generating acid by the irradiation of radiation and not affecting the formation of resist patterns. In particular, acid generators which have excellent optical transparency in the vicinity of 248.4 nm so as to maintain high transparency of a resist composition, or whose optical transparency is improved by exposure to maintain the high transparency of a resist composition, or which exerts its effect even when added in a minute amount due to its high acid generating efficiency are preferable. Specific examples of particularly preferable acid generators include compounds expressed by the following formulae-(XIII), (XIV), (XV), (XVI), and (XVII):

(XIII)

wherein $R_{100}$ and $R_{101}$ independently represent $C_{1-6}$ linear, branched, or cyclic alkyl or aralkyl group, and W represents sulfonyl group or carbonyl group.

(XIV)

wherein $R_{103}$ and $R_{104}$ independently represents hydrogen atom, halogen atom, or $C_{1-4}$ alkyl group, and $R_{105}$ represents $C_{1-6}$ linear, branched or cyclic alkyl group, aralkyl group, or substituted or unsubstituted phenyl group, and V represents sulfonyl group or carbonyl group.

(XV)

wherein $R_{106}$, $R_{107}$ and $R_{108}$ independently represents hydrogen atom, $C_{1-6}$ alkyl group, $C_{1-6}$ alkoxy group, or t-butoxycarbonyloxy group, $R_{109}$ represents $C_{1-8}$ fluorinated alkyl group, substituted or unsubstituted phenyl group, or 10-camphor group, Y represents sulfur atom or iodine atom, and z represents 0 when Y is iodine atom and z represents 1 when Y is sulfur atom.

(XVI)

wherein $R_{110}$ represents $C_{1-6}$ alkyl group, $C_{1-8}$ alkyl group including fluorine, substituted or unsubstituted phenyl group, or 10-camphor group.

(XVII)

wherein $R_{111}$ and $R_{112}$ independently represents hydrogen atom, methyl group, or ethyl group, or $R_{111}$ and $R_{112}$ may form aromatic ring group or bridged alicyclic hydrocarbon group having unsaturated bonding, $R_{113}$ represents $C_{1-6}$ alkyl group, $C_{1-8}$ alkyl group including fluorine, substituted or unsubstituted phenyl group, or 10-camphor group.

Specific examples of the preferable acid generator which may be expressed by the formula (XIII) include 1-cyclohexylsulfonyl-1-(1,1-dimethylethylsulfonyl) diazomethane, bis(1,1-dimethylethylsulfonyl) diazomethane, bis(1-methylethylsulfonyl) diazomethane, bis(cyclohexylsulfonyl) diazomethane, 1-cyclohexylsulfonyl-1-cyclohexylcarbonyl diazomethane, 1-diazo-1-cyclohexylsulfonyl-3,3-dimethylbutan-2-one, 1-diazo-1-(1,1-dimethylethylsulfonyl)-3,3-dimethylbutan-2-one, and so forth.

Specific examples of the acid generators expressed by the formula (XIV) include bis(p-toluenesulfonyl) diazomethane, bis(2,4-dimethylbenzenesulfonyl) diazomethane, bis(p-tert-butylphenylsulfonyl) diazomethane, bis(p-chlorbenzenesulfonyl) diazomethane, methylsulfonyl-p-toluenesulfonyl diazomethane, cyclohexylsulfonyl-p-toluenesulfonyl diazomethane, 1-p-toluenesulfonyl-1-cyclohexylcarbonyl diazomethane, 1-diazo-1-(p-toluenesulfonyl)-3,3-dimethylbutan-2-one, and so forth.

Specific examples of the acid generators expressed by the formula (XV) include triphenylsulfonium•trifluoromethane sulfonate, triphenylsulfonium•perfluorobutane sulfonate, triphenylsulfonium•perfluorooctane sulfonate, triphenylsulfonium•p-toluenesulfonate, triphenylsulfonium•10-camphor sulfonate, diphenyl-p-tolylsulfonium•trifluoromethane sulfonate, diphenyl-p-tolylsulfonium•perfluorobutane sulfonate, diphenyl-p-tolylsulfonium•perfluorooctane sulfonate, diphenyl-p-tolylsulfonium•p-toluenesulfonate, diphenyl-p-tolylsulfonium-•10-camphor sulfonate, diphenyl-p-tert-butylphenylsulfonium•trifluoromethane sulfonate, diphenyl-p-tert-butylphenylsulfonium•perfluorobutane sulfonate, diphenyl-p-tert-butylphenylsulfonium•perfluorooctane sulfonate, diphenyl-p-tert-butylphenylsulfonium•p-toluenesulfonate, diphenyl-p-tert-butylphenylsulfonium•10-camphor sulfonate, diphenyl-p-tert-butylphenylsulfonium•p-fluorobenzenesulfonate, diphenyl-p-cyclohexylphenylsulfonium•trifluoromethane sulfonate, diphenyl-p-cyclohexylphenylsulfonium•perfluorobutane sulfonate, diphenyl-p-cyclohexylphenylsulfonium•perfluorooctane sulfonate, diphenyl-p-cyclohexylphenylsulfonium•p-toluene sulfonate, diphenyl-p-tert-butoxyphenylsulfonium•trifluoromethane sulfonate, diphenyl-p-tert-butoxyphenylsulfonium•perfluorobutane sulfonate, diphenyl-p-tert-butoxyphenylsulfonium•perfluorooctane sulfonate, diphenyl-p-tert-butoxyphenylsulfonium•p-toluenesulfonate, diphenyl-p-tert-butoxycarbonyloxyphenylsulfonium•perfluorooctane sulfonate, diphenyl-p-tert-butoxycarbonyloxyphenylsulfonium-•10-camphor sulfonate, diphenyl-p-tert-butoxycarbonyloxyphenylsulfonium•p-toluene sulfonate, 4,4'-di-tert-butyldiphenyliodonium-•10-camphor sulfonate, and so forth.

Specific examples of the acid generators expressed by the formula (XVI) include 1,2,3-tris-methanesulfonyloxy benzene, 1,2,3-tris-trifluoromethane sulfonyloxy benzene, 1,2,3-tris-perfluorooctane sulfonyloxy benzene, 1,2,3-tris-perfluorobutane sulfonyloxy benzene, 1,2,3-tris-p-toluenesulfonyloxy benzene, 1,2,3-tris-10-camphor sulfonyloxy benzene, 1,2,3-tris-trifluoroacetyloxy benzene, 1,2,4-tris-methanesulfonyloxy benzene, 1,2,4-tris-trifluoromethane sulfonyloxy benzene, 1,2,4-tris-3-tris-perfluorooctane sulfonyloxy benzene, 1,2,4-tris-p-toluenesulfonyloxy benzene, 1,2,4-tris-perfluorobutane sulfonyloxy benzene, and so forth.

Examples of the acid generators expressed by the formula (XVII) include, for example, succinimide•trifluoromethane sulfonate, succinimide•perfluorobutane sulfonate, succinimide•perfluorooctane sulfonate, succinimide•p-toluenesulfonate, succinimide•10-comphar sulfonate, succinimide•methane sulfonate, succinimide •1-methylethane sulfonate, succinimide•benzene sulfonate, dimethylsuccinimide•trifluoromethane sulfonate, dimethylsuccinimide•perfluorooctane sulfonate, dimethylsuccinimide•p-toluenesulfonate, phthalimide•trifluoromethanesulfonate, phthalimide•perfluorobutane sulfonate, phthalimide•perfluorooctane sulfonate, phthalimide•p-toluenesulfonate, phthalimide•10-comphar sulfonate, phthalimide•methanesulfonate, phthalimide•benzenesulfonate, 5-norbonene-2,3-dicarboxyimide•trifluoromethane sulfonate, 5-norbonene-2,3-dicarboxyimide•perfluorobutane sulfonate, 5-norbonene-2,3-dicarboxyimide perfluorooctane sulfonate, 5-norbonene-2,3-dicarboxyimide.p-toluenesulfonate, 5-norbonene-2,3-dicarboxyimide•10-camphar sulfonate, 5-norbonene-2,3-dicarboxyimide•methanesulfonate, and so forth.

When used as a resist composition, it is preferable to mix at least one kind of polymer having the repeating unit expressed by the formula (I) with a polymer used for a conventional amplifier positive type resist, if necessary, and to combine with one or arbitrary two or more kinds of acid generators expressed by the formula (XIII) to (XVII). Examples of preferable combination of two or more kinds of acid generators include an acid generator expressed by the formula (XIII) which has excellent optical transparency to maintain high transparency of a resist composition, low temperature dependency in heating process (PEB) after exposure, and generates weak acid by the exposure, with an acid generator expressed by the formula (XIV), (XV), (XVI), or (XVII) which has high acid generating efficiency at a certain exposure amount or generate strong acid. Such combinations are preferable from the viewpoint of improving the shape of edge portions of a pattern and removing scum. Among such combinations, it is particularly preferable to combine an acid generator expressed by the formula (XIII) with an acid generator expressed by the formula (XIV) and/or (XV).

Also, as for the structural ratio of acid generators when two or more kinds thereof are used, 1–70 parts by weight, preferably 10–50 parts by weight, of an acid generator expressed by the formula (XIV), (XV), or (XVI) may be present with respect to 100 parts by weight of acid generator expressed by the formula (XIII).

Moreover, various triphenylsulfonium salt and diphenyliodonium salt ($PF_6^-$, $AsF_6^-$, $BF_4^-$ and so forth are counter anions of onium salts thereof) and tris(trichloromethyl)-s-triazine/triethanolamine, tris(trichloromethyl)-s-triazine/acetamide and so forth which are conventionally used may be utilized singularly or in mixture of two or more, or these may be mixed with a compound expressed by the above formulae of (XIII) to (XVII).

Basic compounds which may be used for a resist composition of the present invention are not particularly limited as long as they are capable of adjusting sensitivity by addition. Non-limited examples thereof include basic compounds which are normally used in this field, such as, polyvinyl pyridine, poly(vinylpyridine/methylmethacrylate), pyridine, piperidine, tribenzylamine, N-methyl-2-pyrrolidone, monoalkyl amines (examples of alkyl groups include $C_{1-12}$ linear, branched, or cyclic alkyl group, and 2-methylcyclohexylamine, 4-tert-cyclohexylamine, etc., are preferable), dialkyl amines (examples of alkyl groups include $C_{1-12}$ linear, branched, or cyclic alkyl group, and dicyclohexylamine, di-n-octylamine, etc., are preferable), trialkyl amines (examples of alkyl groups include $C_{1-12}$ linear, branched, or cyclic alkyl group, and tri-n-propylamine, tri-n-butylamine, tri-n-octylamine, tri-n-hexylamine, triethylamine, dicyclohexylmethylamine, dicyclohexylethylamine, N-methyl-di-n-octylamine, dimethyl-n-dodecyl amine, tris(2-ethylhexyl)amine, etc., are preferable), mono, di, trialkanol amines (triisopropanol amine, triethanol amine, etc., are preferable), tris[2-(2-methoxyethoxy)ethyl] amine, tetraalkylammonium hydroxide (examples of alkyl groups include $C_{1-12}$ linear, branched, or cyclic alkyl group, and tetramethylammonium hydroxide, tetraethylammonium hydroxide, tetra-n-propylammonium hydroxide, tetra-n-butylammonium hydroxide, etc., are preferable), and so forth. The above basic compounds are generally used in mixture of two or more.

Solvent which may be used for a resist composition of the present invention is not particularly limited as long as it is capable of dissolving polymer having a repeating unit expressed by the formula (I), or the polymer, acid generators, basic compounds, and additives, such as ultraviolet absorbents, acidic compounds, and surfactants, which may be added if necessary. In general, however, those having excellent film forming property and which do not absorb in the vicinity of 220–300 nm are preferable. Specific examples of these include methyl Cellosolve acetate, ethyl Cellosolve acetate, propylene glycolmonomethylether acetate, propylene glycol monoethylether acetate, methyl lactate, ethyl lactate, 2-ethoxyethyl acetate, methyl pyruvate, ethyl pyruvate, 3-methoxy methylpropionate, 3-methoxy ethylpropionate, 2-hydroxy ethybutyrate, 3-hydroxy ethylbutate, N-methyl-2-pyrrolidone, N,N-dimethylformamide, N,N-dimethyl acetoamide, γ-butyrolactone, γ-propyolactone, cyclohexanone, methyl ethyl ketone, 2-heptanone, 1,4-dioxane, diethylene glycol monomethyl ether, diethylene glycol dimethyl ether, ethylene glycol monoisopropyl ether, and so forth. The above solvents are generally used singularly or in combination of two or more.

In the resist composition of the present invention, the mixing ratio of the polymer having the repeating unit expressed by the formula (I) with the acid generator is 1 to 30 parts by weight, preferably 1 to 20 parts by weight, of the acid generator with respect to 100 parts by weight of the polymer. The amount of basic compound in the resist composition of the present invention is 0.5 to 20 parts by weight, preferably 1 to 10 parts by weight, with respect to 1,000 parts by weight of the polymer. Also, although the amount of solvent in the resist composition of the present invention is not particularly limited as long as it does not interfere with the application of obtained positive type resist composition on a substrate, it is generally 1 to 20 parts by weight, preferably 1.5 to 10 parts by weight, with respect to 1 part by weight of the polymer.

Although the resist composition of the present invention includes the above-mentioned four components, i.e., the polymer having the repeating unit expressed by the formula (I), the acid generator, the basic compound, and the solvent, as it main constituents, ultraviolet ray absorbents or acidic compounds may be used, if necessary, in order to solve the problem of scum or improve the state of edges at interfaces between a substrate. Also, a surfactant may be used in order to improve the film forming properties, prevent radial unevenness, and increase wettability.

Examples of the ultraviolet absorbents which may be used for the resist composition of the present invention, if necessary, include 9-diazofuorenone and derivatives thereof, 1-diazo-2-tetralone, 2-diazo-1-tetralone, 9-diazo-10-phenantlone, 2,2',4,4'-tetrakis(o-naphtoquinone diazido-4-sulfonyloxy) benzophenone, 2,2', 4,4'-tetrahydroxy benzophenone, 1,2,3-tris(o-naphthoquinonediazido-4-sulfonyloxy) propane, 9-(2-methoxyethoxy) methylanthracene, 9-(2-ethoxyethoxy) methylanthracene, 9-(4-methoxybutoxy) methylanthracene, 9-anthracenemethyl acetate, dihydroxyflavanone, quercetin, trihydroxy flavanone, tetrahydroxy flavanone, 4',6-dihydroxy-2-naphto benzophenone, 4,4'-dihydroxy benzophenone, 2,2',4,4'-tetrahydroxybenzophenone, and so forth.

Examples of the acidic compounds which may be used for the resist composition of the present invention, if necessary, include organic acids, such as phthalic acid, succinic acid, malonic acid, benzoic acid, salicylic acid, m-hydroxy benzoic acid, p-hydroxy benzoic acid, o-acetyl benzoic acid, o-acetyl oxybenzoic acid, o-nitro benzoic acid, thiosalicylic acid, and thionicotinic acid, salicylaldehyde, salicylhydroxamic acid, succinicimide, phthalicimide, saccharin, ascorbic acid, and so forth.

Also, examples of the surfactants include nonionic surfactants, such as polyethylene glycol stearate, polyethylene glycol dilaurate, polyethylene glycol, polypropylene glycol, polyoxyethylene stearyl ether, polyoxyethylene lauryl ether, polyoxyethylene cetyl ether, polyoxyethylene nonyl ether, and polyoxyethylene octylphenyl ether, other various commercially available nonionic surfactants, fluorine containing nonionic surfactants, fluorine containing cationic surfactants, and fluorine containing anionic surfactants. Among the above surfactants, fluorine containing nonionic surfactants, such as FLORADO (a product of Sumitomo 3M Ltd.), SURFLON (a product of Asahi Glass Co., Ltd.), UNIDINE (a product of Daikin Industries, Ltd), (a product of Dainippon Ink and Chemicals Incorporated), and EFTOP (a product of Tochem Products Co., Ltd.), which have excellent resist film forming properties are particularly preferable.

Moreover, diethyl phthalate, dibutyl phthalate, dipropyl phthalate, etc., may be used, if necessary, as a plasticizer.

Amount of the above ultraviolet ray absorbents, acidic compounds, surfactants, or plasticizers, which may be used if necessary, in the resist composition of the present invention is, for example, 0.1 to 10 parts by weight, preferably 0.1 to 5 parts by weight, with respect to 100 parts by weight of the polymer, respectively.

Formation of a pattern using the resist composition of the present invention is carried out, for example, as follows. The resist composition of the present invention is applied with rotation onto, for example, a semiconductor substrate, such as a silicon wafer, or a semiconductor substrate on which a radiation absorbing coating (any coating formed by rotation application of organic type antireflection agent, baking, CVD of inorganic antireflection agent, or sputtering) so that the thickness thereof becomes about 0.3 to 2 μm, and this is pre-baked, for example, in an oven at a temperature of 70 to 150° C. for 10 to 30 minutes, or on a hotplate at a temperature of 70 to 150° C. for 1 to 2 minutes. Then, a mask for forming a target pattern is held on the above-mentioned resist film, and after irradiating far ultraviolet rays of 300 nm or less so that the exposure value becomes about 1 to 100 mJ/cm², it is baked (PEB) on a hotplate at a temperature of 70 to 150° C. for 1 to 2 minutes. Then, a developing process is carried out by means of a conventional method of dipping (Dip) method, puddle method, or spray method, using developer, such as 0.1 to 5% tetramethyl ammonium hydroxide (TMAH) aqueous solution to form a target pattern on the substrate.

The developer used for the above-mentioned pattern formation method may be selected, depending on the solubility of the resist composition, from alkali solution having appropriate concentration which makes the difference in solubility of exposed parts and unexposed parts large, and is generally selected within the range of 0.01 to 20%. Also, examples of the alkali solution used include organic amines, such as TMAH, choline, and triethanol amine, and aqueous solution including inorganic alkali, such as NaOH and KOH.

The resist composition of the present invention generates acid by the irradiation of not only far-ultraviolet rays and KrF excimer laser beam but also i-ray exposure, electron beam, and soft X-rays, and is chemically amplified. Accordingly, the resist composition of the present invention is a resist composition which is capable of forming a pattern by the irradiation of low exposure far-ultraviolet rays, KrF excimer laser beam, i-ray exposure, electron beam, and soft X-rays using chemical amplifying effect.

Next, effect of the polymer of the present invention when it is used as a resist composition will be explained with examples. First, acid is generated due to photo reaction at a part which is exposed to far ultraviolet rays, KrF excimer laser beam, and so forth.

When the exposed part is subjected to a heat treatment after the exposure process, the ester groups in the main chain are cleaved to become low molecular weight oligomer or monomer which is alkali soluble, and is dissolved in developer during a developing process.

On the other hand, functional groups of unexposed parts are not subjected to chemical changes by acids since no acids are generated, and hence are hardly dissolved in an alkali developer. Accordingly, the rate of dissolution in an alkali developer between the exposed parts and the unexposed parts becomes significantly large when a pattern is formed using the resist composition of the present invention, and hence resolution is improved and DOF is enlarged.

Since the effects of this characteristic increase as the thickness of the resist film decreases, this is extremely advantageous for making the resist membrane thinner, which will become necessary for the design rules hereafter.

BEST MODE FOR CARRYING OUT THE INVENTION

Hereinafter, the present invention will be explained in detail with reference to Examples. However, the scope of the present invention is not limited to these Examples by any means.

Hereinafter, methods for purifying reagents and solvent used in Examples of the present invention will be explained.

Solvents and raw materials used were purified in accordance with ordinary procedure. Tetrahydrofuran (THF) was distilled from sodium benzophenon ketyl. Ketens were distilled under reduced pressure after reacting acid chloride with triethylamine in THF at room temperature. Lithium chloride was heated and dried in a polymerization container under vacuum pressure. Aldehydes were distilled under reduced pressure after adding $CaH_2$.

As for lithium n-butyl (n-BuLi), a commercially available n-BuLi hexane solution (1.6 mol/l) was used without any modification.

SYNTHETIC EXAMPLE 1

(1) Synthesis of Ethyl Phenyl Ketene (EPK)

A THF solution of 2-phenyl butyryl chloride (55 g, 0.3 mol) was added dropwise to a mixture of triethyl amine (91 g, 0.9 mol) in THF under nitrogen atmosphere. After one hour, precipitated triethyl amine hydrochloride was filtered. Filtrate was distilled under reduced pressure and EPK was obtained (60–70° C./4 mmHg). Amount obtained was 30 g (yield was 70%).

(2) Copolymerization of EPK with 4-methoxy benzaldehyde (MBA)

After 1.9 g (45 millimole) of lithium chloride was heated and dried under vacuum, 100 ml of THF was added under nitrogen atmosphere and the mixture was cooled to –40° C. After 4.4 g (32 millimole) of MBA and 4.4 g (30 millimole) of EPK were added, 0.93 ml (1.5 millimole) of the hexane solution of n-BuLi, and the reaction was continued for 30 minutes at –40° C. After the reaction was terminated by adding methanol, it was added to a large quantity of methanol to cause reprecipitation. The precipitate thus obtained was filtered and dried under reduced pressure, and 8.5 g of white powdery polymer (a) was obtained. The polymer (a) was analyzed using gel permeation chromatography (hereinafter abbreviated as "GPC"), and it was found that the polymer was a polymer having Mn of 4,700 and Mw/Mn of 1.16.

SYNTHETIC EXAMPLE 2

(1) Synthesis of 4-(2'-ethoxyethoxy) benzaldehyde (EEBA)

After dissolving 24.4 g (0.2 mole) of 4-hydroxy benzaldehyde in 200 ml of ethyl acetate, 21.6 g (0.3 mole) of ethyl vinyl ether and 0.2 ml (2 millimole) of hydrochloric acid were added, and the mixture was stirred overnight at room temperature. Then, after adding $Na_2CO_3$ aqueous solution to neutralize, the mixture was separated and the upper layer was washed with water until pH thereof reached 7. After adding $MgSO_4$ to dry, the mixture was filtered, concentrated and dried, and distilled under reduced pressure to obtain EEBA (100–105° C./0.4 mmHg). Amount obtained was 20 g (yield was 50%).

(2) Copolymerization of EPK with EEBA

The same procedure as described in Synthetic Example 1 (2) was repeated except that EEBA was used instead of MBA and white powdery polymer (b) was obtained. The polymer (b) was analyzed using GPC, and it was found that the polymer was a polymer having Mn of 4,800 and Mw/Mn of 1.25.

SYNTHETIC EXAMPLE 3

(1) 4-(t-butoxycarbonyloxy) benzaldehyde (BOCBA)

After dissolving 24.4 g (0.2 mole) of 4-hydroxy benzaldehyde in 200 ml of THF, 52.4 g (0.24 mole) of di-t-butyldicarbonate and 15 mg (0.2 millimole) of N,N-dimethylamino pyridine were added, and the mixture was stirred overnight at room temperature. Then, after adding $Na_2CO_3$ aqueous solution to neutralize, the mixture was separated and the upper layer was washed with water until pH thereof reached 7. After adding $MgSO_4$ to dry, the mixture was filtered, concentrated, and recrystalized from methanol to obtain BOCBA. Amount obtained was 35 g (yield was 80%).

(2) Copolymerization of EPK with BOCBA

The same procedure as described in Synthetic Example 1 (2) was repeated except that BOCBA was used instead of MBA, and white powdery polymer (c) was obtained. The polymer (c) was analyzed using GPC, and it was found that the polymer was a polymer having Mn of 5,000 and Mw/Mn of 1.16.

SYNTHETIC EXAMPLE 4

Copolymerization of EPK with MBA and BOCBA

The same procedure as described in Synthetic Example 1 (2) was repeated except that MBA/BOCBA (molar ratio of 3/1) was used instead of MBA, and white powdery polymer (d) was obtained. The polymer (d) was analyzed using GPC, and it was found that the polymer was a polymer having Mn of 4,800 and Mw/Mn of 1.15. Also, the copolymerization proportion measured by NMR was MBA/BOCBA =3/1.

SYNTHETIC EXAMPLE 5

Polymer (e) including the repeating unit expressed by the following formula was prepared in accordance with the method described in Macromolecular, 2002, 35, 6149:

SYNTHETIC EXAMPLE 6

After heating and vacuum drying 2.5 g (60 millimole) of lithium chloride, 60 ml of THF was added under nitrogen atmosphere, and the mixture was cooled to −40° C. Then, after adding 1.2 ml (2 millimole) of the hexane solution of n-BuLi, a mixed solution of 3.8 g (28 millimole) of MBA, 3.1 g (14 millimole) of BOCBA, 5.8 g (40 millimole) of EPK, and 20 ml of THF was added dropwise, and the reaction was continued for 30 minutes at −40°C. After the reaction was terminated by adding methanol, it was added to a large quantity of methanol to cause reprecipitation. The precipitates thus obtained was filtered and dried under reduced pressure, and 11 g of white powdery polymer (j) was obtained. The polymer (j) was analyzed using GPC, and it was found that the polymer was polymer having Mn of 6,000 and Mw/Mn of 1.24. Also, the copolymerization proportion measured by NMR was MBA/BOCBA=2/1.

SYNTHETIC EXAMPLE 7

After heating and vacuum drying 2.5 g (60 millimole) of lithium chloride, 60 ml of THF was added under nitrogen atmosphere, and the mixture was cooled to −40° C. Then, after adding 1.2 ml (2 millimole) of the hexane solution of n-BuLi, a mixed solution of 1.5 g (11 millimole) of MBA, 7.1 g (32 millimole) of BOCBA, 5.8 g (40 millimole) of EPK, and 20 ml of THF was added dropwise, and the reaction was continued for 30 minutes at −40° C. After the reaction was terminated by adding methanol, it was added to a large quantity of methanol to cause reprecipitation. The precipitate thus obtained was filtered and dried under reduced pressure, and 14 g of white powdery polymer (k) was obtained. The polymer (k) was analyzed using GPC, and it was found that the polymer was a polymer having Mn of 6,600 and Mw/Mn of 1.20. Also, the copolymerization proportion measured by NMR was MBA/BOCBA=1/3.

SYNTHETIC EXAMPLE 8

After heating and vacuum drying 2.5 g (60 millimole) of lithium chloride, 60 ml of THF was added under nitrogen atmosphere, and the mixture was cooled to −40° C. Then, after adding 1.2 ml (2 millimole) of the hexane solution of n-BuLi, a mixed solution of 9.3 g (42 millimole) of BOCBA, 5.8 g (40 millimole) of EPK, and 20 ml of THF was added dropwise, and the reaction was continued for 30 minutes at −40° C. After the reaction was terminated by adding methanol, it was added to a large quantity of methanol to cause reprecipitation. The precipitate thus obtained was filtered and dried under reduced pressure, and 13 g of white powdery polymer (1) was obtained. The polymer (1) was analyzed using GPC, and it was found that the polymer was polymer having Mn of 8,000 and Mw/Mn of 1.16.

REFERENCE EXAMPLE 1

After dissolving 50 g of poly(p-hydroxy styrene) (VP-8000, a product of Nippon Soda Co., Ltd., Mn=10,000, and Mw/Mn=1.13) in 200 ml of THF under nitrogen atmosphere, 60 mg of N,N-diamino pyridine and 11 g of di-t-butyl carbonate were added, and the mixture was stirred for one day at room temperature. Then, after concentrating the reaction solution, the concentrated solution was added to a large quantity of methanol to precipitate polymer, and polymer (f) was obtained after filtration, washing, and vacuum drying. The polymer (f) was analyzed using GPC, and it had Mn of 14,000 and Mw/Mn of 1.13.

REFERENCE EXAMPLE 2

After dissolving 50 g of poly(p-hydroxy styrene) (VP-8000, a product of Nippon Soda Co., Ltd., Mn=10,000, and Mw/Mn=1.13) in 200 ml of ethyl acetate under nitrogen atmosphere, 58 g of ethyl vinyl ether and 0.3 ml of concentrated hydrochloric acid were added, and the mixture was stirred for one day at room temperature. Then, after adding sodium carbonate to the reaction solution to separate, the solution was washed repeatedly until it was neutralized. After being concentrated, the solution was added to a large quantity of methanol to precipitate polymer, and polymer (g) was obtained after filtration, washing, and vacuum drying. The polymer (g) was analyzed using GPC, and it had Mn of 13,500 and Mw/Mn of 1.13.

REFERENCE EXAMPLE 3

After cooling 85 g of THF to −60° C. under nitrogen atmosphere, 7 millimole of sec-butyl lithium was added and 14 g (0.1 mole) of t-butyl methacrylate was added dropwise. After the reaction was continued for one hour, the reaction was terminated by adding methanol, and it was added to a large quantity of methanol to precipitate polymer. After filtration, washing, and vacuum drying, polymer (h) was obtained. The polymer (h) was analyzed using GPC, and it had Mn of 4,000 and Mw/Mn of 1.10.

EXAMPLE 1

Each of the polymers (a) to (e) (5 g each) was dissolved in 50 ml of toluene/ethanol mixed solvent, and after adding 150 mg of concentrated sulfuric acid, it was heated at 70° C. The rate of change in molecular weight was calculated using the following equation based on the change in molecular weight at an initial peak top and that at a peak top after the reaction using GPC:

Rate of change in molecular weight=(initial molecular weight−molecular weight after reaction)/initial molecular weight×100

Results are shown in Table 1

COMPARATIVE EXAMPLE 1

The reaction was carried out using the same condition as in Example 1 except that polymers (f)–(h), and poly ε-caprolactone (a product of Wako Pure Chemical Industries, Ltd., Mn=17,000, polymer (i)) were used.

TABLE 1

|  |  | Reaction rate (%) | |
| --- | --- | --- | --- |
|  |  | Two-hour reaction | Four-hour reaction |
| Example 1 | Polymer (a) | 5 | 10 |
|  | Polymer (b) | 60 | 70 |
|  | Polymer (c) | 60 | 70 |
|  | Polymer (d) | 20 | 25 |
|  | Polymer (e) | 60 | 70 |
| Comparative Example 2 | Polymer (f) | 15 | 25 |
|  | Polymer (g) | 20 | 25 |
|  | Polymer (h) | 0 | 1 |
|  | Polymer (i) | 80 | 90 |

EXAMPLE 2

Each of the polymers (a) to (e) (100 mg each) was dissolved in 10 ml of THF, and after adding 3 mg of camphor sulfonic acid, it was cast to obtain a film of about 10 μm thickness. The obtained film was heated to 140° C. The rate of change in molecular weight was calculated using the following equation based on the change in molecular weight at an initial peak top and that at a peak top after the reaction using GPC:

Rate of change in molecular weight=(initial molecular weight−molecular weight after reaction)/initial molecular weight×100

Results are shown in Table 2

COMPARATIVE EXAMPLE 2

The reaction was carried out using the same condition as in Example 2 except that polymers (f)–(i) were used. Results are shown in Table 2.

TABLE 2

|  |  | Molecular weight rate of change (%) | |
| --- | --- | --- | --- |
|  |  | Two-minute reaction | Four-minute reaction |
| Example 1 | Polymer (a) | 5 | 15 |
|  | Polymer (b) | 95 | 95 |
|  | Polymer (c) | 95 | 95 |
|  | Polymer (d) | 30 | 35 |
|  | Polymer (e) | 95 | 95 |
| Comparative Example 2 | Polymer (f) | 25 | 25 |
|  | Polymer (g) | 20 | 25 |
|  | Polymer (h) | 0 | 5 |
|  | Polymer (i) | 3 | 5 |

EXAMPLE 3

A resist solution was prepared by dissolving polymers (j), (k), and (l) in propylene glycol monomethylether acetate (PGMEA) so that a resin solid content concentration became 12%, and adding triphenyl sulfonium trifluoromethane sulfonate so that the content thereof became 1.0% by weight with respect to the resin solid content. A film of the above resist solution was formed on a silicon wafer using a spin coater (a product of Mikasa Co.), and it was heated at 90° C. on a hotplate for 60 seconds to obtain a thin film of 400 nm thickness. After being exposed to light having a wavelength of 248 nm, it was heated at 110° C. on a hotplate for 90 seconds, and the film thickness thereof was measured. The relationship between the exposure dose and the film thickness is shown in FIG. 1.

Figure 1:
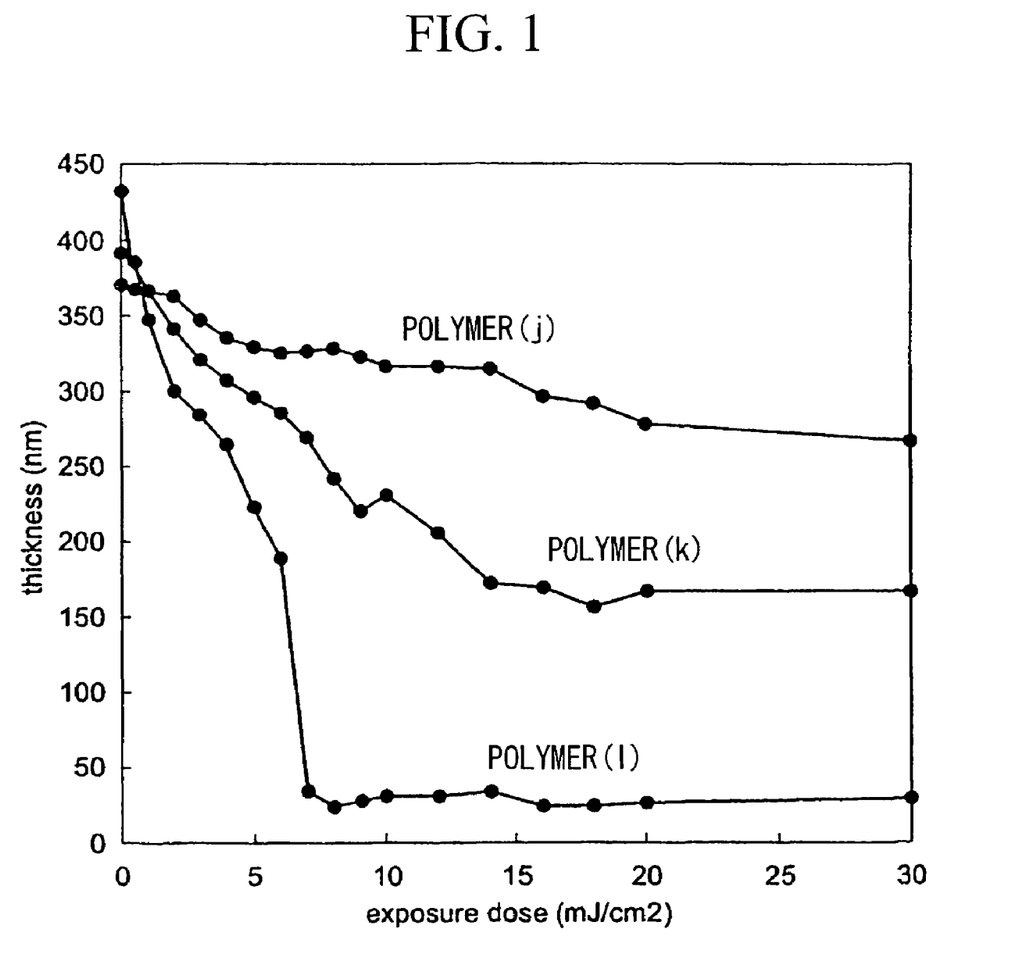
FIG. 1 is a graph showing the relationship between exposure dose and the thickness of a film in Examples 3.

As shown in FIG. 1, it was observed that the film thickness decreased by exposure and heating without being alkali developed. That is, main chain scission effectively occurred by the exposure, and the composition was changed to low molecular compounds having high volatility.

EXAMPLE 4

A resist solution was prepared using the polymers (O) and (k) in the same manner as in Example 3. A film was formed using the same method, and it was heated at 90° C. on a hotplate for 60 seconds to obtain a thin film of 400 nm thickness. The obtained thin film was subjected to an RIE treatment using the following conditions, and the etching rate was measured by measuring the film thickness. Results are tabulated in Table 3.

RIE Treatment Conditions

Device: SAMCO load lock type RIE device MODEL RIE 200-L

Gas: $O_2$: $SF_6$=5:30 (sccm)

Pressure: 6 Pa

Output: 150 W/24 cmΦ

Time: 30 sec

COMPARATIVE EXAMPLE 3

The reaction was carried out as in Example 4 except that a commercially available resist material UV 82 (a product of Shipley Co.) was used. Results of the above are tabulated in Table 3.

TABLE 3

| | Resist material | Etching rate (Å/sec) | Relative etching rate |
|---|---|---|---|
| Example 4 | Polymer (j) | 42.93 | 0.92 |
| | Polymer (k) | 46.43 | 0.99 |
| C. Example 3 | UV82 | 46.73 | 1.00 |

From the results shown in Table 3, it is clear that the compositions of the present invention have etching tolerance at least equal to that of a commercially available product.

INDUSTRIAL APPLICABILITY

As described above, in the composition including ketene-aldehyde copolymer of the present invention, since main chains of the copolymer are cleaved by acid with high sensitivity so as to be decomposed to low molecular weight components, it becomes possible to significantly change the properties of the composition before and after the decomposition. Also, the rate of acid decomposition, the molecular weight of decomposed products, etc., may be arbitrarily controlled based on the copolymerization ratio of ketene and aldehyde, and the kind and ratio of the acid labile protecting group. Moreover, since it is possible to introduce various substituents into side chains and the molecular weight thereof may be arbitrarily controlled, the acid degradable resin composition of the present invention exhibits excellent effects as a resist material and has high industrial applicability.

The invention claimed is:

1. An acid-degradable composition, comprising: a polymer having a repeating unit represented by the following general formula (I):

(I)

wherein $R_1$ and $R_2$ independently represent halogen atom, $C_{1-20}$ hydrocarbon group, a heterocyclic group, a cyano group, a nitro group, a $C(=O)R_4$ group, $S(O)_nR_4$ group, $P(=O)(R_4)_2$ group or $M(R_4)_3$ group; $R_3$ represents $C_{1-20}$ hydrocarbon group or a heterocyclic group; $R_4$ represents $C_{1-20}$ hydrocarbonoxy group, $C_{1-20}$ hydrocarbon group, $C_{1-20}$ hydrocarbonthio group or mono- or di-$C_{1-20}$ hydrocarbonamino group; M represents a silicon, germanium, tin or lead atom; and n is 0, 1 or 2; and an acid or a compound capable of generating an acid in response to an external stimulus.

2. An acid-degradable composition according to claim 1, wherein the external stimulus is at least one selected from the group consisting of heat, pressure, and radiation.

3. An acid-degradable composition according to claim 1, wherein the compound capable of generating an acid in response to an external stimulus is a photosensitive compound which generates an acid by radiation irradiation.

4. A photoresist composition, comprising: a polymer component having a repeating unit represented by the following formula (I):

(I)

wherein $R_1$ and $R_2$ independently represent halogen atom, $C_{1-20}$ hydrocarbon group, a heterocyclic group, a cyano group, a nitro group, a $C(=O)R_4$ group, $S(O)_nR_4$ group, $P(=O)(R_4)_2$ group or $M(R_4)_3$ group; $R_3$ represents $C_{1-20}$ hydrocarbon group or a heterocyclic group: $R_4$ represents $C_{1-20}$ hydrocarbonoxy group, $C_{1-20}$ hydrocarbon group, $C_{1-20}$ hydrocarbonthio group or mono- or di-$C_{1-20}$ hydrocarbonamino group; and M represents a silicon, germanium, tin or lead atom: and n is 0, 1 or 2.

5. A photoresist composition, comprising the acid-degradable composition according to claim 1.

6. A photoresist composition according to claim 4, further comprising solvent.

7. A photoresist composition according to claim 4, further comprising a basic compound.

8. An acid-degradable composition according to claim 1, wherein the $R_1$ and $R_2$ independently represent $C_{1-20}$ hydrocarbon group, and the $R_3$ represents $C_{1-20}$ hydrocarbon group or a heterocyclic group in the formula (I).

9. An acid degradable composition according to claim 1, wherein the $R_3$ in the formula (I) is a substituent represented by the following formula (II):

(II)

wherein $R_5$ represents hydrogen, or an acid degradable eliminable group, $R_6$ represents a halogen atom or $C_{1-20}$ hydrocarbon group, m represents an integer of 1–3 and p represents 0 or an integer of 1–3 so as to satisfy m+p≦5 when m is 2 or greater, $R_5$ may be the same or different from each other, and when p is 2 or greater, $R_6$ may be the same or different from each other.

10. An acid-degradable composition according to claim 1, wherein a number average molecular weight of the polymer having the repeating unit represented by the formula (I) is within a range of 2,000 to 50,000.

11. An acid-degradable composition according to claim 1, wherein a ratio (Mw/Mn) of a weight average molecular weight (Mw) and a number average molecular weight (Mn) of the polymer having the repeating unit represented by the formula (I) is within a range of 1.01 to 3.00.

12. A photoresist composition according to claim 5, further comprising solvent.

13. A photoresist composition according to claim 5, further comprising a basic compound.

14. A photoresist composition according to claim 4, wherein the $R_1$ and $R_2$ independently represent $C_{1-20}$ hydrocarbon group, and the $R_3$ represents $C_{1-20}$ hydrocarbon group or a heterocyclic group in the formula (I).

15. A photoresist composition according to claim 4, wherein the $R_3$ in the formula (I) is a substituent represented by the following formula (II):

wherein $R_5$ represents hydrogen, or an acid degradable·eliminable group, $R_6$ represents a halogen atom or $C_{1-20}$ hydrocarbon group, m represents an integer of 1–3 and p represents 0 or an integer of 1–3 so as to satisfy $m+p \leq 5$, when m is 2 or greater, $R_5$ may be the same or different from each other, and when p is 2 or greater, $R_6$ may be the same or different from each other.

16. A photoresist composition according to claim 4, wherein a number average molecular weight of the polymer having the repeating unit represented by the formula (I) is within a range of 2,000 to 50,000.

17. A photoresist composition according to claim 4, wherein a ratio (Mw/Mn) of a weight average molecular weight (Mw) and a number average molecular weight (Mn) of the polymer having the repeating unit represented by the formula (I) is within a range of 1.01 to 3.00.

18. A polymer comprising: a repeating unit represented by the following formula (I):

wherein $R_1$ and $R_2$ independently represent halogen atom, $C_{1-20}$ hydrocarbon group, a heterocyclic group, a cyano group, a nitro group, a C(=O)$R_4$ group, S(O)$_n R_4$ group, P(=O)($R_4$)$_2$ group or M($R_4$)$_3$ group; $R_3$ represents a substituted or unsubstituted $C_{1-20}$ hydrocarbon group, or a substituted or unsubstituted heterocyclic group, provided that $R_3$ is not p-propenyloxyphenyl, p-methoxyphenyl, or p-(t-butylsiloxy-dimethyl) phenyl when $R_1$ is an ethyl group and $R_2$ is a phenyl group; $R_4$ represents $C_{1-20}$ hydrocarbonoxy group, $C_{1-20}$ hydrocarbon group, $C_{1-20}$ hydrocarbonthio group or mono- or di-$C_{1-20}$ hydrocarbonamino group; M represents a silicon, germanium, tin or lead atom; and n is 0, 1 or 2.

19. A polymer according to claim 18, wherein $R_1$ and $R_2$ independently represent $C_{1-20}$ hydrocarbon group, and $R_3$ represents $C_{1-20}$ hydrocarbon group or a heterocyclic group in the formula (I).

20. A polymer according to claim 18, wherein $R_3$ in the formula (I) is a substituent represented by the following formula (II):

wherein $R_5$ represents hydrogen, or an acid degradable·eliminable group, $R_6$ represents a halogen atom or $C_{1-20}$ hydrocarbon group, m represents an integer of 1–3 and p represents 0 or an integer of 1–3 so as to satisfy $m+p \leq 5$ when m is 2 or greater, $R_5$ may be the same or different from each other, and when p is 2 or greater, $R_6$ may be the same or different from each other.

21. A polymer according to claim 18, wherein a number average molecular weight (Mn) of the polymer having the repeating unit represented by the formula (I) is within a range of 2,000 to 50,000.

22. A polymer according to claim 18, wherein a ratio (Mw/Mn) of a weight average molecular weight (Mw) and a number average molecular weight (Mn) of the polymer having the repeating unit represented by the formula (I) is within a range of 1.01 to 3.00.

* * * * *

UNITED STATES PATENT AND TRADEMARK OFFICE
CERTIFICATE OF CORRECTION

| | | |
|---|---|---|
| PATENT NO. | : 7,105,272 B2 | Page 1 of 1 |
| APPLICATION NO. | : 10/504496 | |
| DATED | : September 12, 2006 | |
| INVENTOR(S) | : Takeshi Endo et al. | |

It is certified that error appears in the above-identified patent and that said Letters Patent is hereby corrected as shown below:

Two Inventors have been omitted. Please insert:

-- Takeshi Endo, Yonezawa-shi, (JP) and Fumio Sanda, Kyoto-shi (JP) --.

Signed and Sealed this

Nineteenth Day of December, 2006

JON W. DUDAS
*Director of the United States Patent and Trademark Office*